United States Patent [19]
Sanderson et al.

[11] Patent Number: 5,235,287
[45] Date of Patent: Aug. 10, 1993

[54] FREQUENCY MEASUREMENT RECEIVER WITH BANDWIDTH IMPROVEMENT THROUGH PHASE SHIFTED SAMPLING OF REAL SIGNALS USING SAMPLING RATE SELECTION

[76] Inventors: Richard B. Sanderson, 2317 Pine Knott Dr., Dayton, Ohio 45431; James B. Y. Tsui, 1431 Cliffside Ct., Dayton, Ohio 45440

[21] Appl. No.: 726,093

[22] Filed: Jul. 5, 1991

[51] Int. Cl.$^5$ ............................................. G01R 23/00
[52] U.S. Cl. ........................ 324/76.35; 324/76.55; 324/76.47; 324/76.82; 324/76.78; 342/196; 341/123; 364/485
[58] Field of Search ................ 341/122, 123; 364/485; 342/18, 196, 14; 324/78 D, 83 Q, 79 D, 77 D, 77 B, 77 H

[56] References Cited

U.S. PATENT DOCUMENTS

| | | | |
|---|---|---|---|
| 3,708,746 | 1/1973 | Willett . | |
| 4,336,541 | 6/1982 | Tsui . | |
| 4,504,785 | 3/1985 | Tucker | 324/77 H |
| 4,633,516 | 12/1986 | Tsui | 455/226 |
| 4,893,266 | 1/1990 | Deem | 364/726 |
| 5,099,194 | 3/1992 | Sanderson | 324/79 D |
| 5,099,243 | 3/1992 | Tsui | 324/77 B |
| 5,109,188 | 4/1992 | Sanderson | 324/78 D |

*Primary Examiner*—Kenneth A. Wieder
*Assistant Examiner*—Jose M. Solis

[57] ABSTRACT

This is a technique for extending the frequency range which employs a power divider having two outputs, one output being supplied to a first A/D converter, and the other output being supplied via a delay device to a second A/D converter. A processor receives the outputs of the two A/D converters. In operation, the input signal is subjected to a known delay $\tau$ and both original and delayed signals are sampled simultaneously. Both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform. The phase difference between the original and delayed signals is calculated and an approximation to the true frequency for each peak observed in the amplitude spectrum is estimated using the expression $$\phi = 2\pi f \tau$$

where $\tau$ is the delay.

In general, one would expect that when $f\tau < 1$, one can recover the input frequency. However, effects associated with the sampling limit the input bandwidth to $f < 1/\tau$. A specific sampling rate is used which can restore the unambiguous bandwidth to $$f < 1/\tau.$$

1 Claim, 1 Drawing Sheet

Phase shift sampled case with sample pairs

FREQUENCY MEASUREMENT RECEIVER WITH BANDWIDTH IMPROVEMENT THROUGH PHASE SHIFTED SAMPLING OF REAL SIGNALS USING SAMPLING RATE SELECTION

RIGHTS OF THE GOVERNMENT

The invention described herein may be manufactured and used by or for the Government of the United States for all governmental purposes without the payment of any royalty.

CROSS REFERENCE TO RELATED APPLICATIONS

There are three related patents by the same applicants, filed on Mar. 6, 1991: (1) Digital Frequency Measurement Receiver With Bandwidth Improvement Through Multiple Sampling of Complex Signals, U.S. Pat. No. 5,099,243; (2) Digital Frequency Measurement Receiver With Bandwidth Improvement Through Multiple Sampling of Real Signals, U.S. Pat. No. 5,099,194; and (3) Instantaneous Frequency Measurement Receiver With Bandwidth Improvement Through Phase Shifted Sampling of Real Signals, U.S. Pat. No. 5,109,188. These three copending patents are hereby incorporated by reference.

BACKGROUND OF THE INVENTION

The present invention relates generally to an instantaneous frequency measurement receiver with bandwidth improvement through phase shifted sampling of real signals.

The conventional Instantaneous Frequency Measurement (IFM) receiver is a radio frequency (rf) receiver used primarily in electronic warfare (EW). Its basic function is to measure the frequency of pulsed signals radiated from hostile radar. Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video provides signals whose amplitudes are related to the phase delay. These video signals typically take the form sin $\omega\tau$ or cos $\omega\tau$, where $\omega$ is the angular frequency of the processed input signal and $\omega$ is the delay time. The sin $\omega\tau$/cos $\omega\tau$ signals are delivered to the encoding network which makes amplitude comparisons of the signals, determines the numerical value of $\omega$, and generates the digital frequency descriptive word.

An IFM receiver has many attractive features necessary for EW applications, such as small size, light weight, wide instantaneous bandwidth, and fine frequency resolution.

In a digital rf receiver, the incident radiation is mixed with a local oscillator signal and down converted to an intermediate frequency (IF). This IF signal is discretely sampled and further processing is done using digital techniques. The frequency of the incident radiation may be determined by performing a discrete Fourier transform on the sampled signal. The range of frequencies that can be determined by such methods is limited by aliasing effects that limit the frequency range to $f_s/2$, the Nyquist frequency, where $f_s$ is the uniform sampling frequency. In order to measure frequencies over a wide range, a very high sampling frequency must be used.

United States patents of interest include U.S. Pat. No. 4,336,541, to Tsui et al, which teaches an IFM receiver that detects the difference of two or more rf signals between the onset of the first rf signal pulse and the completion of the frequency encoding strobe. U.S. Pat. No. 4,504,785 to Tucker et al teaches a sampling spectrum analyzer wherein an input signal is split and each resulting portion is passed down a tapped delay line with samples being taken at each tap processed by separate arithmetic units. U.S. Pat. No. 4,633,516 to Tsui teaches an IFM receiver with an A-D converter which permits elimination of a phase correlator. U.S. Pat. No. 3,708,746 to Willet teaches a system for analyzing the frequency of an incident signal including a digital filter wherein the center frequency of the incident signal is varied by changing the sampling rate. U.S. Pat. No. 4,893,266 to Deem discloses an alias tagging time domain to frequency domain signal converter.

SUMMARY OF THE INVENTION

An objective of the invention is to double the unambiguous bandwidth of a frequency measurement receiver (an rf receiver that measures the frequency of an incident signal) with bandwidth improvement through phase shifted sampling of real signals.

The invention overcomes the problem that in a digital receiver in order to measure frequencies over a wide range a very high sampling frequency must be used.

The device according to the invention for extending the frequency range comprises, a power divider having two outputs, one output being supplied to a first A-D converter, and the other output being supplied via a delay device to a second A-D converter A processor receives the outputs of the two A-D converters. In operation, the input signal is subjected to a known delay $\tau$ and both original and delayed signals are sampled simultaneously. Both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform. The phase difference between the original and delayed signals is calculated and an approximation to the true frequency for each peak observed in the amplitude spectrum is estimated using the expression $$\phi = 2\pi f\tau$$

where $\tau$ is the delay and $\phi$ is the phase shift.

In general, one would expect that when $f\tau < 1$, one can recover the input frequency. However, effects associated with the sampling limit the input bandwidth to $$f < 1/\tau.$$

In the present invention, a specific sampling rate is used which can restore the unambiguous bandwidth to $$f < 1/\tau.$$

DETAILED DESCRIPTION

BANDWIDTH IMPROVEMENT THROUGH PHASE SHIFTED SAMPLING OF REAL SIGNALS — U.S. Pat. No. 5,109,188

Figure 1:
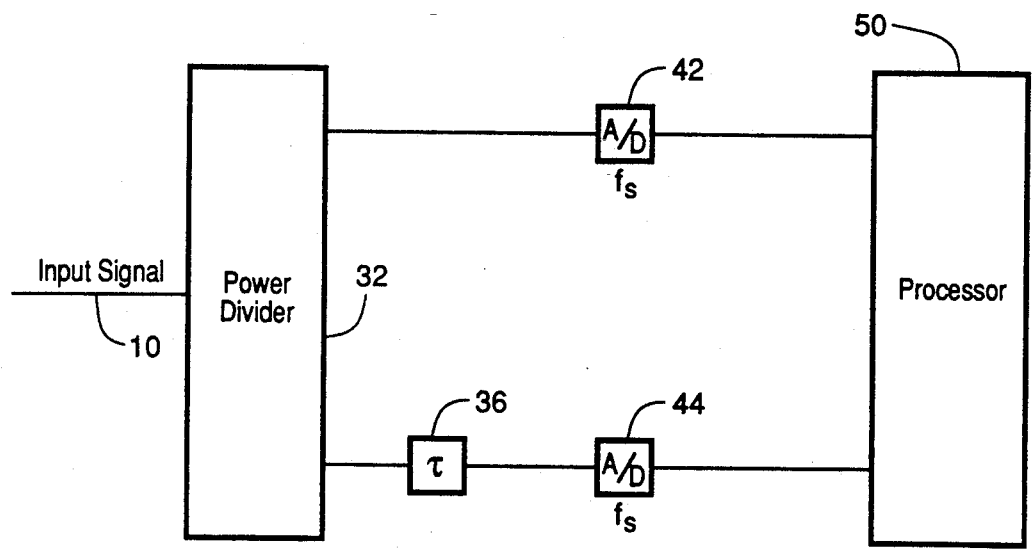
FIG. 1 is a functional block diagram showing an IFM receiver according to the invention.

This proposed approach to extending the frequency range is illustrated in FIG. 1. The incoming rf signal on line 10 is divided in power divider 32. One output of the power divider 32 is applied to an analog-to-digital converter 42, and the other is applied via a delay device 36 providing a delay $\tau$ to an analog-to-digital converter 44. The converters 42 and 44 are operated at a sampling frequency $f_s$. The signals from the converters 42 and 44 are then supplied to a processor 50 to determine the frequency f.

In FIG. 1, the signal is subjected to a known delay $\tau$ and both original and delayed signals are sampled simultaneously. In the processor 50, both sampled signals are Fourier transformed and the phase and amplitudes calculated, using the expressions:

$$\phi(f) = \tan^{-1}[I(f)/R(f)] \tag{1}$$

$$A(f) = [R^2(f) + I^2(f)]^{\frac{1}{2}} \tag{2}$$

where R(f) and I(f) are respectively the real and imaginary parts of the frequency transform. The phase difference between the original and delayed signals is calculated and an approximation to the true frequency for each peak observed in the amplitude spectrum is estimated using the expression $$\phi = 2\pi f \tau \tag{3}$$

where $\tau$ is the delay. If the phase shift is less than $\pi$, this procedure permits an estimate of the approximate value of the true frequency of the signal and, thus, permits determination of the alias which has been mapped to the observed frequency and correction of the observed frequency for aliasing. This may be accomplished in the following manner. Let $f_s$ be the sampling frequency, $f_{ph}$ be the frequency inferred from phase calculations, and f be the aliased frequency obtained from the amplitude spectrum. Repeatedly subtract $f_s$ from $f_{ph}$ until a value less than $f_s/2$ is obtained. If this value of $f_{ph}$ is less than zero, replace f by $-f$ and calculate the corrected value of f to be $$f_{corr} = f + n f_s \tag{4}$$

where n is the number of subtractions performed.

BANDWIDTH IMPROVEMENT THROUGH PHASE SHIFTED SAMPLING OF REAL SIGNALS USING SAMPLING RATE SELECTION

In an instantaneous frequency measurement (IFM) receiver, the phase of the original and delayed signals are measured to determine the frequency of the input signal. The patent application "Instantaneous Frequency Measurement Receiver With Bandwidth Improvement Through Phase Shifted Sampling of Real Signals", Ser. No. 07/672,309, now U.S. Pat. No. 5,109,188, uses a similar idea. The difference between the two methods is that the phase from the conventional IFM correlator is analog and that from the apparatus described in the patent application is digital. For the IFM receiver, the phase shift is a linear function of frequency increasing monotonically except for $2\pi$ discontinuities.

Figure 2:
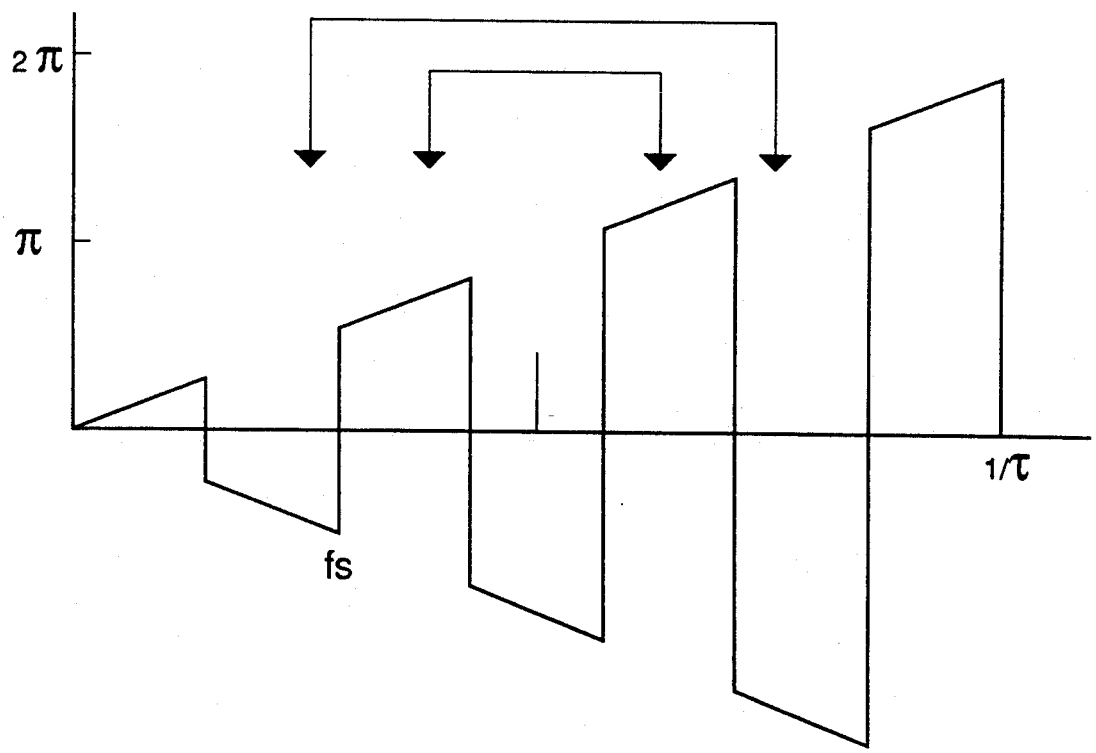
FIG. 2 is a graph showing phase shift for sampled case with sample pairs.

In the sampled case, the phase changes sign at multiples of half the sampling frequency, $f_s/2$, as shown in FIG. 2. The possibility of observing either sign of the phase change introduces a further ambiguity into the frequency determination. Calculation of the phase using the relation $$\theta = \tan^{-1}(Im\ A_d/Re\ A_d) - \tan^{-1}(Im\ A_u/Re\ A_u) \tag{5}$$

where Re and Im represent the real and imaginary parts of a quantity respectively and $A_d$ and $A_u$ are the peak frequency components of the delayed and undelayed sampling respectively, produces two possible phase shifts, a positive phase shift $\theta$ and a negative phase shift $\theta - 2\pi$. If the sampling is such that the frequency calculated from $\theta/2\pi\tau$ should yield a positive phase shift and the frequency calculated from $(\theta - 2\pi)/2\pi\tau$ should yield a negative phase shift, then there is an inherent ambiguity. In the previous patent application, this ambiguity was avoided by restricting the unambiguous band to phase shifts less than $\pi$, i.e. to frequencies less than $\frac{1}{2}\tau$, and considering only the magnitude of the phase shift.

This ambiguity can be eliminated and the full frequency range to $1/\tau$ can be achieved by appropriate choice of the relation between the delay time and the sampling frequency. If we impose the constraint:

$$(q + \tfrac{1}{2}) f_s \tau = 1 \tag{6}$$

where q is an integer, then the two possible phase shifts should have the same sign. Only one of these is consistent with the measured phases and the correct frequency can always be inferred from comparison of the signs. This is illustrated in FIG. 2 where frequency/phase pairs are shown for the case q=3. We see that both members of each frequency/phase pair correspond to the same sign of the phase shift whether positive or negative. Thus, in each case the inconsistent phase can be eliminated and it is always possible to determine unambiguously which frequency is the correct one. The block diagram of FIG. 1 still applies with this improvement, with the value of the sampling frequency $f_s$ chosen in accordance with equation 6.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising:
    power dividing means coupling a source of signals to inputs of first and second analog-to-digital converters, with a delay device providing a delay $\tau$ coupled between the power dividing means and the second analog-to-digital converter; the first and second analog-to-digital converters being operated at a sampling frequency $f_s$, outputs of the first and second analog-to-digital converters being coupled to processing means;

wherein said processing means comprises means for performing Fourier transforms on signals from the first and second analog-to-digital converters, with the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform, means for calculating the phase difference between the original and delayed signals and for estimating an approximation to the true frequency for each peak observed in the amplitude spectrum using the expression $$\phi = 2\pi f \tau;$$

means for inferring a frequency $f_{ph}$ from phase calculations, and using an aliased frequency f obtained from the amplitude spectrum, means for obtaining an estimate of the approximate value of the true frequency of the signal and, thus, determination of the alias which has been mapped to the observed frequency and correction of the observed frequency for aliasing, means for repeatedly subtracting the value of the sampling frequency $f_s$ from the value of the frequency $f_{ph}$ until a value less than $f_s/2$ is obtained, if this value of $f_{ph}$ is less than zero, replacing f by $-f$ and calculating the corrected value of f to be $$f_{corr} = f + n f_s$$

where n is the number of subtractions performed;

wherein ambiguity is eliminated and the full frequency range to $1/\tau$ is achieved by appropriate choice of the relation between the delay time and the sampling frequency, wherein said processing means also includes means for imposing the constraint:

$$(q+\tfrac{1}{2})f_s\tau = 1$$

where q is an integer, so that the two possible phase shifts have the same sign, only one of these being consistent with the measured phases and the correct frequency being inferred from comparison of the signs, with both members of each frequency/phase pair corresponding to the same sign of the phase shift whether positive or negative, whereby in each case any phase inconsistency is eliminated and the correct frequency is unambiguously determined.

* * * * *